US009722601B2

United States Patent
Niikura et al.

(10) Patent No.: US 9,722,601 B2
(45) Date of Patent: Aug. 1, 2017

(54) GATE DRIVING CIRCUIT OF HIGH-SIDE TRANSISTOR, SWITCHING OUTPUT CIRCUIT, INVERTER DEVICE, AND ELECTRONIC DEVICE

(71) Applicant: ROHM CO., LTD., Ukyo-Ku, Kyoto (JP)

(72) Inventors: Hiroki Niikura, Kyoto (JP); Takafumi Morinaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/833,389

(22) Filed: Aug. 24, 2015

(65) Prior Publication Data
US 2016/0065205 A1 Mar. 3, 2016

(30) Foreign Application Priority Data
Aug. 26, 2014 (JP) ................... 2014-171827

(51) Int. Cl.
*H03K 17/687* (2006.01)
*H02M 7/5387* (2007.01)
*H02P 27/06* (2006.01)

(52) U.S. Cl.
CPC ........ *H03K 17/687* (2013.01); *H02M 7/5387* (2013.01); *H02P 27/06* (2013.01)

(58) Field of Classification Search
CPC combination set(s) only.
See application file for complete search history.

(56) References Cited

U.S. PATENT DOCUMENTS

| 6,664,822 B2 * | 12/2003 | Watabe | H02M 7/538 |
| | | | 327/108 |
| 9,325,317 B2 * | 4/2016 | Akahane | H03K 17/04123 |
| 9,350,352 B2 * | 5/2016 | Koike | H03K 19/018521 |

FOREIGN PATENT DOCUMENTS

| JP | H09200020 A | 7/1997 |
| JP | H09232929 A | 9/1997 |

* cited by examiner

*Primary Examiner* — Hai L Nguyen
(74) *Attorney, Agent, or Firm* — Cantor Colburn LLP

(57) ABSTRACT

A gate driving circuit for turning on a high-side transistor when an input set pulse is asserted and turning off the high-side transistor when an input reset pulse is asserted is provided. The gate driving circuit includes first and second inverters to receive the intermediate set pulse from a level shift circuit to generate first and second set pulses; third and fourth inverters to receive the intermediate reset pulse from the level shift circuit to generate first and second reset pulses; a logic circuit to mask the first set pulse and the first reset pulse by using the second reset pulse and the second set pulse to generate an output set pulse and an output reset pulse, respectively; a flip-flop configured to receive the output set pulse and the output reset pulse to output a driving pulse; and a driver to drive the high-side transistor according to the driving pulse.

10 Claims, 15 Drawing Sheets

FIG. 6B

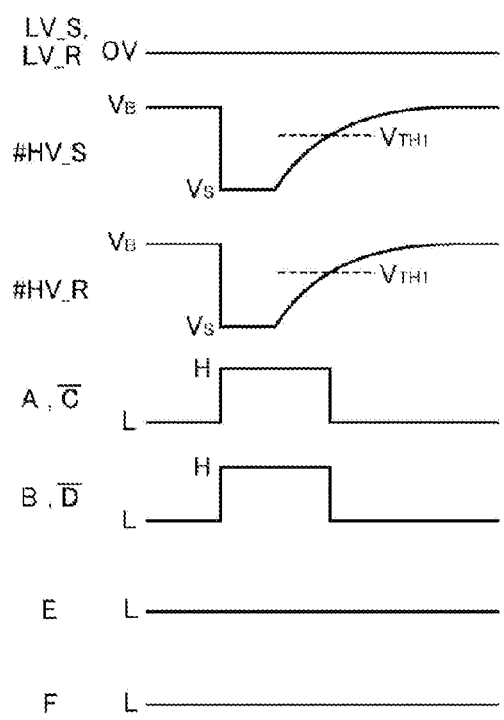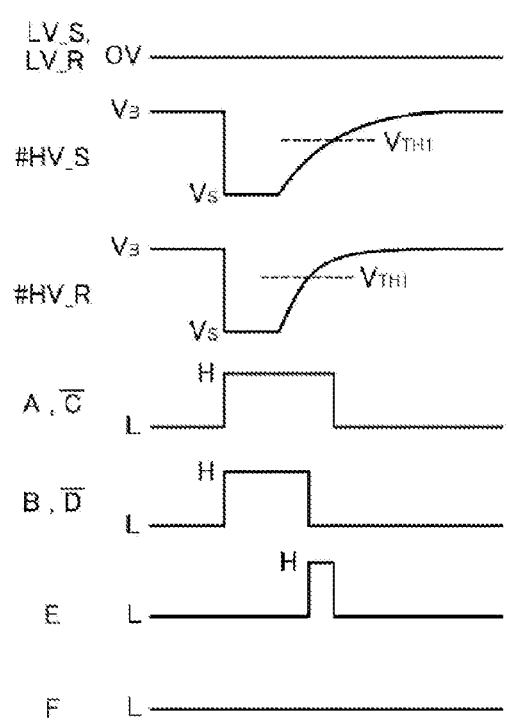

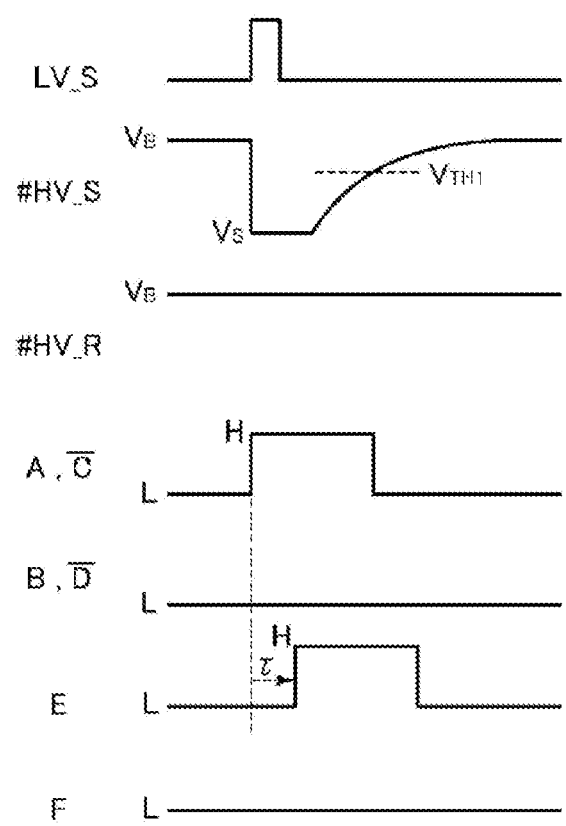

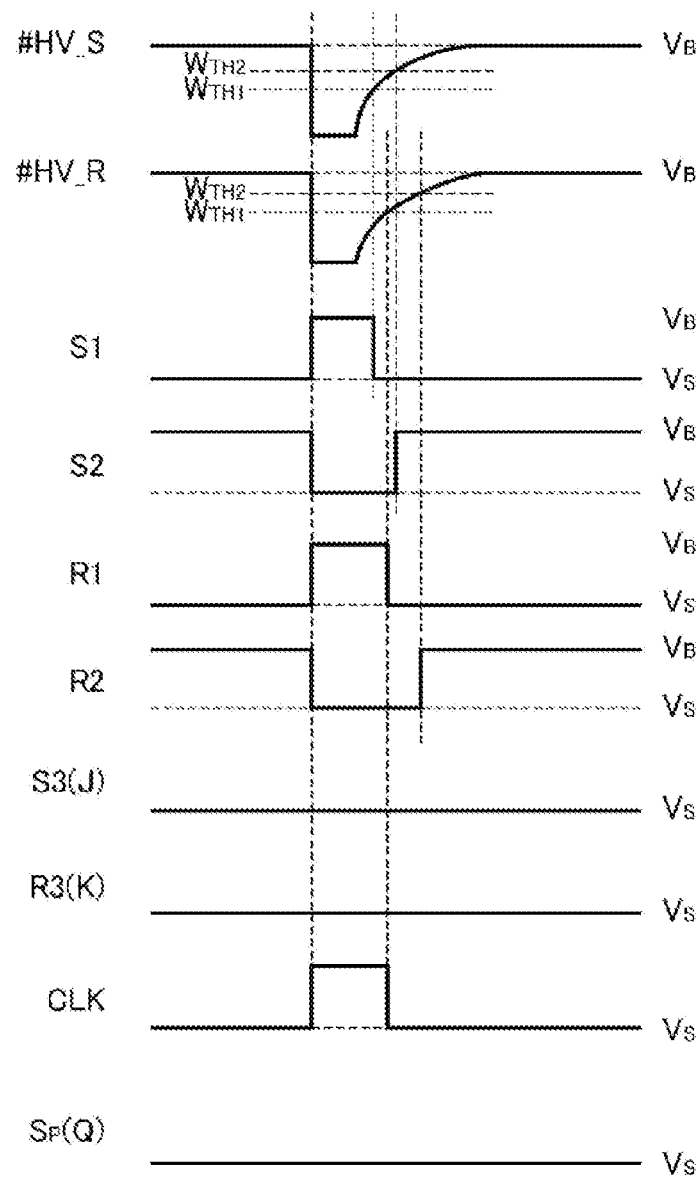

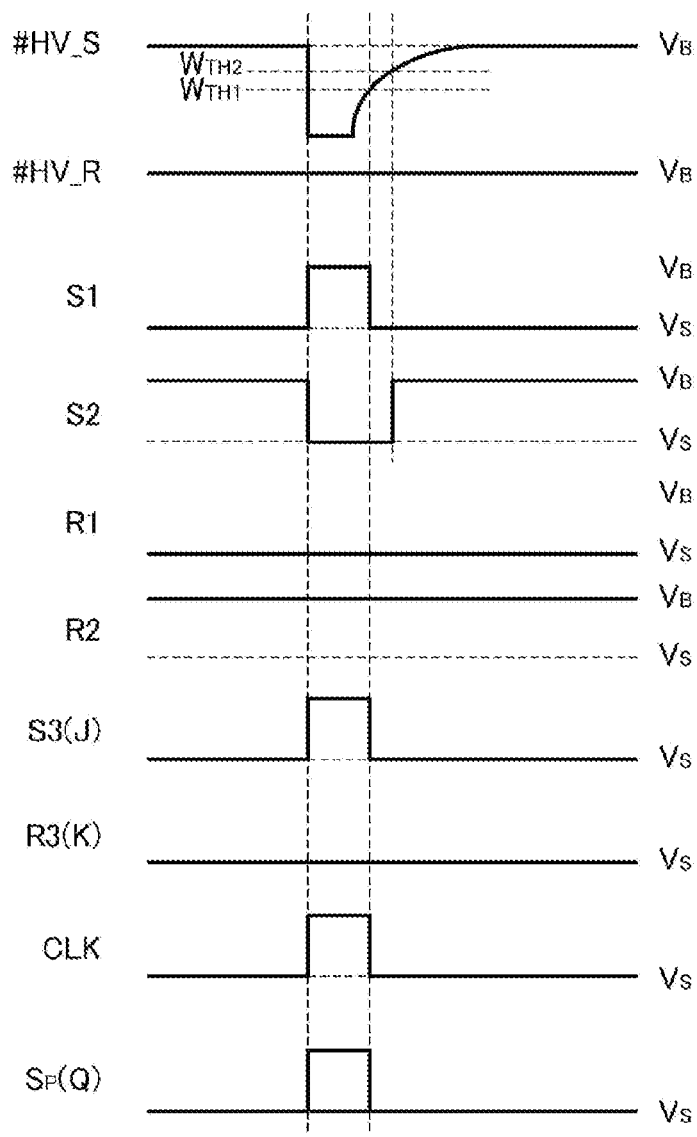

GATE DRIVING CIRCUIT OF HIGH-SIDE TRANSISTOR, SWITCHING OUTPUT CIRCUIT, INVERTER DEVICE, AND ELECTRONIC DEVICE

CROSS-REFERENCE TO RELATED APPLICATION

The present invention claims priority under 35 U.S.C. §119 to Japanese Application No. 2014-171827, filed on Aug. 26, 2014, the entire content of which is incorporated herein by reference.

TECHNICAL FIELD

The present disclosure relates to a gate driving circuit for switching a high-side transistor.

BACKGROUND

A half bridge circuit, an H bridge circuit, a three-phase bridge circuit (hereinafter, collectively referred to as a "switching output circuit") using a power transistor are used in various electronic circuits including a motor driver, an inverter, and a converter.

FIG. 1 is a circuit diagram of a switching output circuit reviewed by the present inventors. A switching output circuit 100r includes a bridge circuit 106 of an output stage and a gate driving circuit 108r for driving the bridge circuit 106. The bridge circuit 106 includes a high-side transistor M1 installed between an input power line (hereinafter, also simply referred to as an "input line") 102 and an output line 104, and a low-side transistor M2 installed between the output line 104 and a ground line 103. The high-side transistor M1 and the low-side transistor M2 are configured with an N-channel MOSFET or an IGBT. For example, an input voltage $V_{IN}$ is tens of volts to hundreds of volts (here, 600 V), and an output voltage $V_{OUT}$ is switched between a ground voltage 0 V as a low level and 600 V as a high level.

The gate driving circuit 108r complementarily switches the high-side transistor M1 and the low-side transistor M2 based on control signals $S_{IN\_H}$ and $S_{IN\_L}$.

In order to turn on the high-side transistor M1, it is required to apply a voltage higher than the input voltage $V_{IN}$ of 600 V to a gate of the high-side transistor M1. When a voltage (e.g., 20 V) lower than 600 V is supplied as a power supply voltage $V_{CC}$ of the gate driving circuit 108r, so-called bootstrap circuits D1 and C1 are used. A switching terminal (VS terminal) of the gate driving circuit 180r is connected to a source of the high-side transistor M1 and a drain of the low-side transistor M2. One end of the capacitor C1 is connected to the VS terminal, and the other end thereof is connected to a bootstrap terminal VB of the gate driving circuit 180r. A cathode of the diode D1 is connected to the VB terminal and an anode thereof is connected to the VCC terminal. As the high-side transistor M1 is switched, the capacitor C1 is charge-pumped, so that a DC voltage higher than that of the VS terminal by $V_{CC}$-$V_F$ is generated at the VB terminal $V_F$ is a forward voltage of the diode D1. A level shifter 112, a waveform shaper 114, and a high-side driver 116, which will be described later, are operated by a voltage $V_B$ (called a "bootstrap voltage") of the VB terminal as a power supply voltage.

The control signal $S_{IN\_H}$ is a digital signal for instructing ON/OFF of the high-side transistor M1, and a high level thereof corresponds to ON of the high-side transistor M1 and a low level thereof corresponds to OFF of the high-side transistor M1. An edge detection circuit 110 detects a positive edge and a negative edge of the control signal $S_{IN\_H}$, and asserts a set pulse LV_S at a positive edge (set to high level) and asserts a reset pulse LV_R at a negative edge (set to high level). The edge detection circuit 110 operates by receiving the power supply voltage $V_{CC}$, and thus, the high-level voltages of the set pulse LV_S and the reset pulse LV_R become the power supply voltage $V_{CC}$.

The level shifter 112 level-shifts the high level voltages of the set pulse LV_S and the reset pulse LV_R to the bootstrap voltage $V_B$ to generate a set pulse HV_S and a reset pulse HV_R.

The waveform shaper 114 generates a driving pulse $S_P$ that transitions to a first level (e.g., a high level) in response to the set pulse HV_S, and that transitions to a second level (e.g., a low level) in response to the reset pulse HV_R. The high-side driver 116 switches the high-side transistor M1 based on the driving pulse $S_P$.

The low-side driver 118 switches the low-side transistor M2 based on the control signal $S_{IN\_L}$ input to a LIN terminal.

FIG. 2 is a circuit diagram illustrating the level shifter 112 and the waveform shaper 114 reviewed by the present inventors. The level shifter 112 includes high voltage N channel MOS transistors M11 and M12, resistors R11 to R14, and diodes D11 and D12.

The waveform shaper 114 mainly includes an inverting circuit 120 and an RS flip-flop 122. The outputs HV_S and HV_R after being level-shifted by the level shifter 112 of FIG. 2 become logics inverted from the input pulses LV_S and LV_R prior to level shifting (in the present disclosure, # indicates an inverted logic). Thus, the inverting circuit 120 logically inverts the pulses HV_S and HV_R to return them to the same logic levels as the original pulses LV_S and LV_R, respectively. The RS flip-flop 122 receives pulses A and B, which have passed through the inverting circuit 120, to generate a driving pulse $S_P$.

In a three-phase inverter, a certain phase is exposed to noise due to a counter electromotive force of the other phases. Due to this noise, even if both the set pulse LV_S and the reset pulse LV_R are not asserted, the set pulses HV_S and HV_R may be caused to change by fluctuation in the voltage of the VS terminal or the VB terminal.

FIG. 3 is a waveform diagram illustrating an influence of noise in the level shifter 112 and the waveform shaper 114. In the inverted set pulse #HV_S and the inverted reset pulse #HV_R, negative edges are sharply changed, while positive edges gradually transition due to an influence of parasitic capacitance (capacitance between a drain and a source) of the transistors M11 and M12.

Due to the influence of noise, even though the original set pulse LV_S and the reset pulse LV_R are at a low level (negated), both the inverted set pulse #HV_S and the inverted reset pulse #HV_R may be caused to transition to a low level, and thus, both of the pulses A and B outputted from the inverting circuit 120 transition to a high level. That is, a problem arises in that, when the RS flip-flop 122 is a set dominant type, the driving pulse $S_P$ having a low level may transition to a high level, and when the RS flip-flop 122 is a reset dominant type, the driving pulse $S_P$ having a high level may transition to a low level.

In addition, time constants of positive edges of the inverted set pulse #HV_S and the inverted reset pulse #HV_R is determined by parasitic capacitance of the transistors M11 and M12 and resistance values of the resistors R11 and R12, so that a situation in which time constants of the set side and the reset side are different from each other by element variations can be caused. This makes countermeasures of the set pulse A and the reset pulse B due to noise more difficult.

Further, the problems described herein should not be considered as generally recognized by a person skilled in the art but recognized by the present inventors independently. Also, the problem can arise in various bridge circuits, without being limited to the three-phase inverter.

SUMMARY

The present disclosure provides some embodiments of a gate driving circuit operating at a high speed, while suppressing an influence of noise.

According to one embodiment of the present disclosure, there is provided a gate driving circuit for turning on a high-side transistor when an input set pulse is asserted, and turning off the high-side transistor when an input reset pulse is asserted. The gate driving circuit includes a level shift circuit configured to level-shift each of an input set pulse and an input reset pulse to generate an intermediate set pulse and an intermediate reset pulse; a first inverter having a first threshold value, and configured to receive the intermediate set pulse to generate a first set pulse; a second inverter having a second threshold value different from the first threshold value, and configured to receive the intermediate set pulse to generate a second set pulse; a third inverter having the first threshold value, and configured to receive the intermediate reset pulse to generate a first reset pulse; a fourth inverter having the second threshold value, and configured to receive the intermediate reset pulse to generate a second reset pulse; a logic circuit configured to mask the first set pulse by using the second reset pulse to generate an output set pulse, and mask the first reset pulse by using the second set pulse to generate an output reset pulse; a flip-flop configured to receive the output set pulse and the output reset pulse to thereby output a driving pulse of which a level transitions; and a driver configured to drive a high-side transistor according to the driving pulse.

In order to invalidate simultaneous assertion of the set pulse and the reset pulse based on the fact that the set pulse and the reset pulse are not simultaneously asserted during a normal operation, the set pulse is masked by using the reset pulse and the reset pulse is masked by using the set pulse, thereby preventing the output set pulse and the output reset pulse from being asserted by an influence of noise.

Further, by generating the second set pulse as a mask using a threshold value different from that of the first set pulse and similarly generating the second reset pulse as a mask using a threshold value different from that of the first reset pulse, when time constants of an intermediate set pulse and an intermediate reset pulse are different from each other due to unbalance between a set and a reset of the level shifter at a previous stage, it is possible to eliminate a variation of the time constants.

In addition, since a filter using a capacitor is not inserted on a path of the set pulse and the reset pulse, high speed switching can become possible.

The logic circuit may include a first AND gate configured to output a logical product of the first set pulse and an inverted signal of the second reset pulse, as the output set pulse; a second AND gate configured to output a logical product of the first reset pulse and an inverted signal of the second set pulse, as the output reset pulse; and an OR gate configured to output a logical sum of the first set pulse and the second reset pulse, as a clock signal. The flip-flop may include a JK flip-flop configured to receive the output set pulse at a J terminal, the output reset pulse at a K terminal and the clock signal at a clock terminal, and to output the driving pulse.

The logic circuit may include a first NOR gate configured to output a negative logical sum of an inverted signal of the first set pulse and the second reset pulse, as the output set pulse; a second NOR gate configured to output a negative logical product of an inverted signal of the first reset pulse and the second set pulse, as the output reset pulse; and an OR gate configured to output a logical sum of the first set pulse and the second reset pulse, as a clock signal. The flip-flop may include a JK flip-flop configured to receive the output set pulse at a J terminal, the output reset pulse at a K terminal and the clock signal at a clock terminal, and to output the driving pulse.

The logic circuit may include a first NOR gate configured to output a negative logical sum of an inverted signal of the first set pulse and the second reset pulse, as the output set pulse; and a second NOR gate configured to output a negative logical product of an inverted signal of the first reset pulse and the second set pulse, as the output reset pulse. The flip-flop may include an RS flip-flop configured to receive the output set pulse at a set terminal and the output reset pulse at a reset terminal, and to output the driving pulse.

The logic circuit may include a first AND gate configured to output a logical product of the first set pulse and an inverted signal of the second reset pulse, as the output set pulse; and a second AND gate configured to output a logical product of the first reset pulse and an inverted signal of the second set pulse, as the output reset pulse. The flip-flop may include an RS flip-flop configured to receive the output set pulse at a set terminal and the output reset pulse at a reset terminal, to output the driving pulse.

The logic circuit may include an AND gate configured to generate a logical product of the first set pulse and the second reset pulse; a NOR gate configured to generate a negative logical sum of the second set pulse and the second reset pulse; and an RS flip-flop configured to receive an output of the AND gate at a set terminal and an output of the NOR gate at a reset terminal, and to output a clock signal from an inverting terminal, wherein the first set pulse may be outputted as the output set pulse and the first reset pulse may be outputted as the output reset pulse, and the flip-flop may include a JK flip-flop configured to receive the output set pulse at a J terminal, the output reset pulse at a K terminal and the clock signal at a clock terminal, and to output the driving pulse.

According to another embodiment of the present disclosure, there is provided a switching output circuit. The switching output circuit includes a bridge circuit including a high-side transistor and a low-side transistor; and any one of the gate driving circuits described above, configured to drive the high-side transistor and the low-side transistor.

According to further another embodiment of the present disclosure, there is provided an electronic device. The electronic device includes a bridge circuit including a high-side transistor and a low-side transistor; any one of the gate driving circuits described above, configured to drive the high-side transistor and the low-side transistor; and a motor connected to the bridge circuit.

Also, any combination of the foregoing components or substitution of the components and expressions of the present disclosure among a method, an apparatus, a system, and the like is also effective as an embodiment of the present disclosure.

BRIEF DESCRIPTION OF THE DRAWINGS

FIGS. 7A to 7C are waveform diagrams of the waveform shaper of FIG. 6A.

FIGS. 8A and 8B are operation waveform diagrams of the gate driving circuit of FIG. 5.

DETAILED DESCRIPTION

Figure 1:
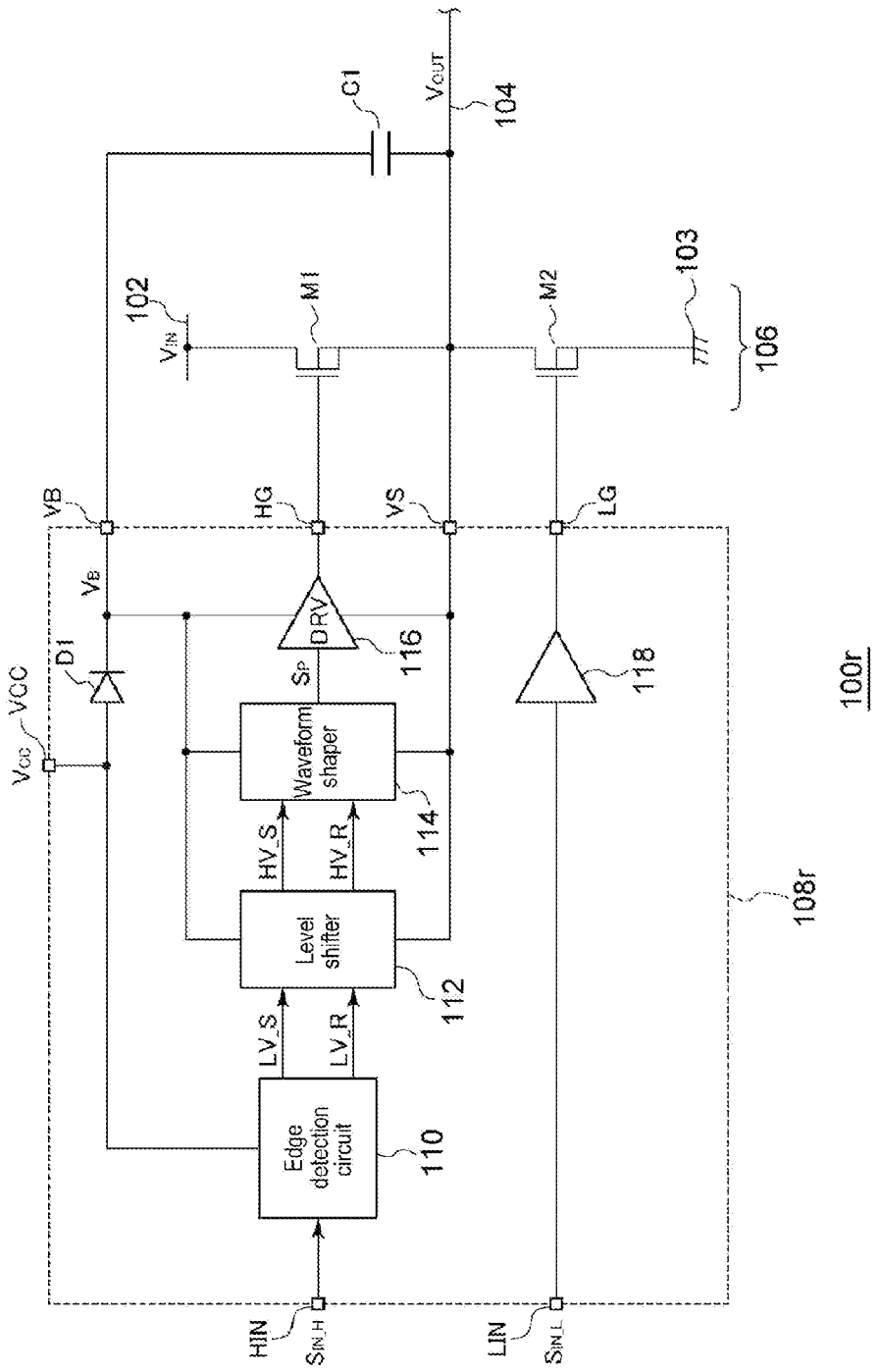
FIG. 1 is a circuit diagram of a switching output circuit reviewed by the present inventors.
Figure 2:
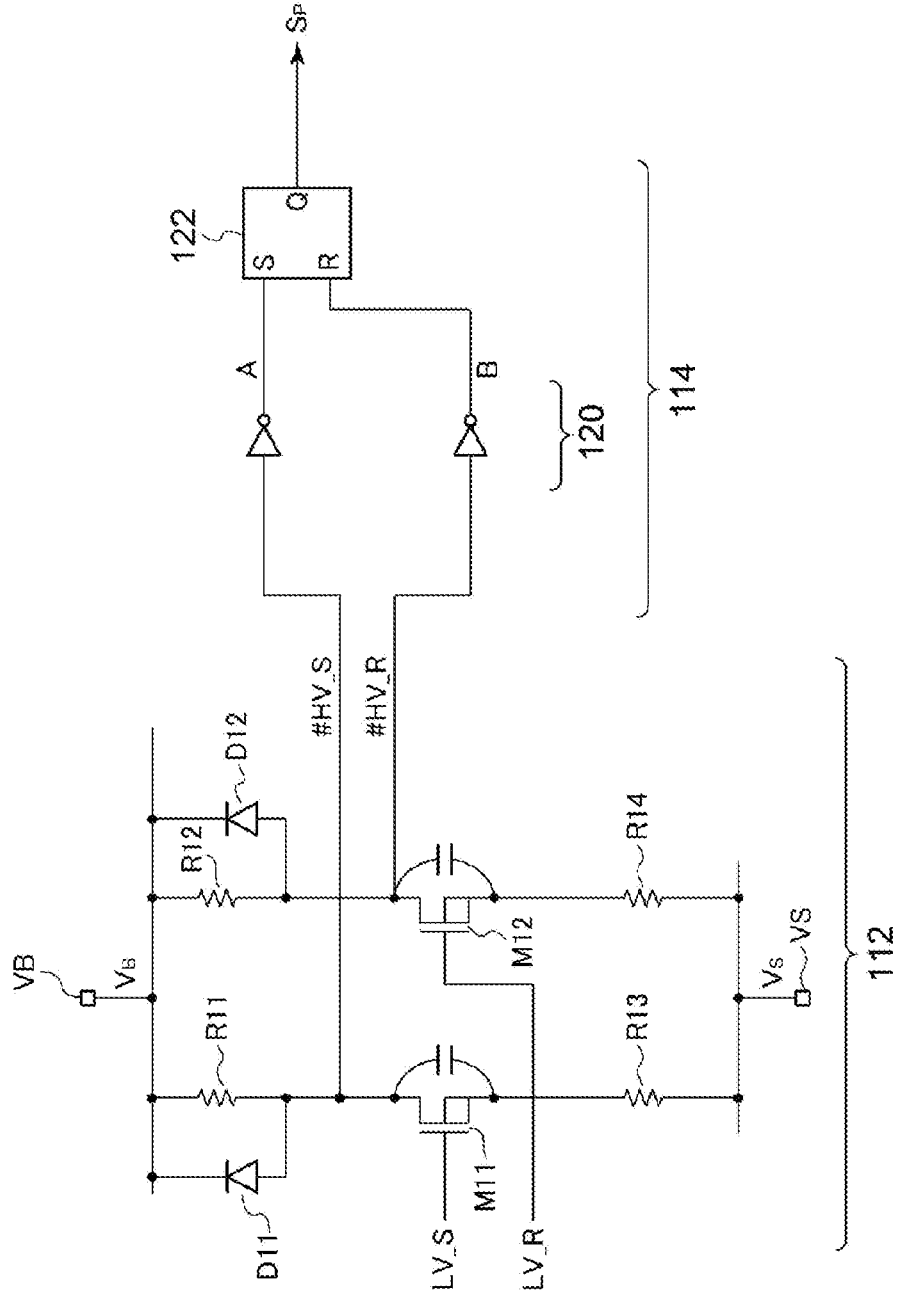
FIG. 2 is a circuit diagram of a level shifter and a waveform shaper reviewed by the present inventors.
Figure 3:
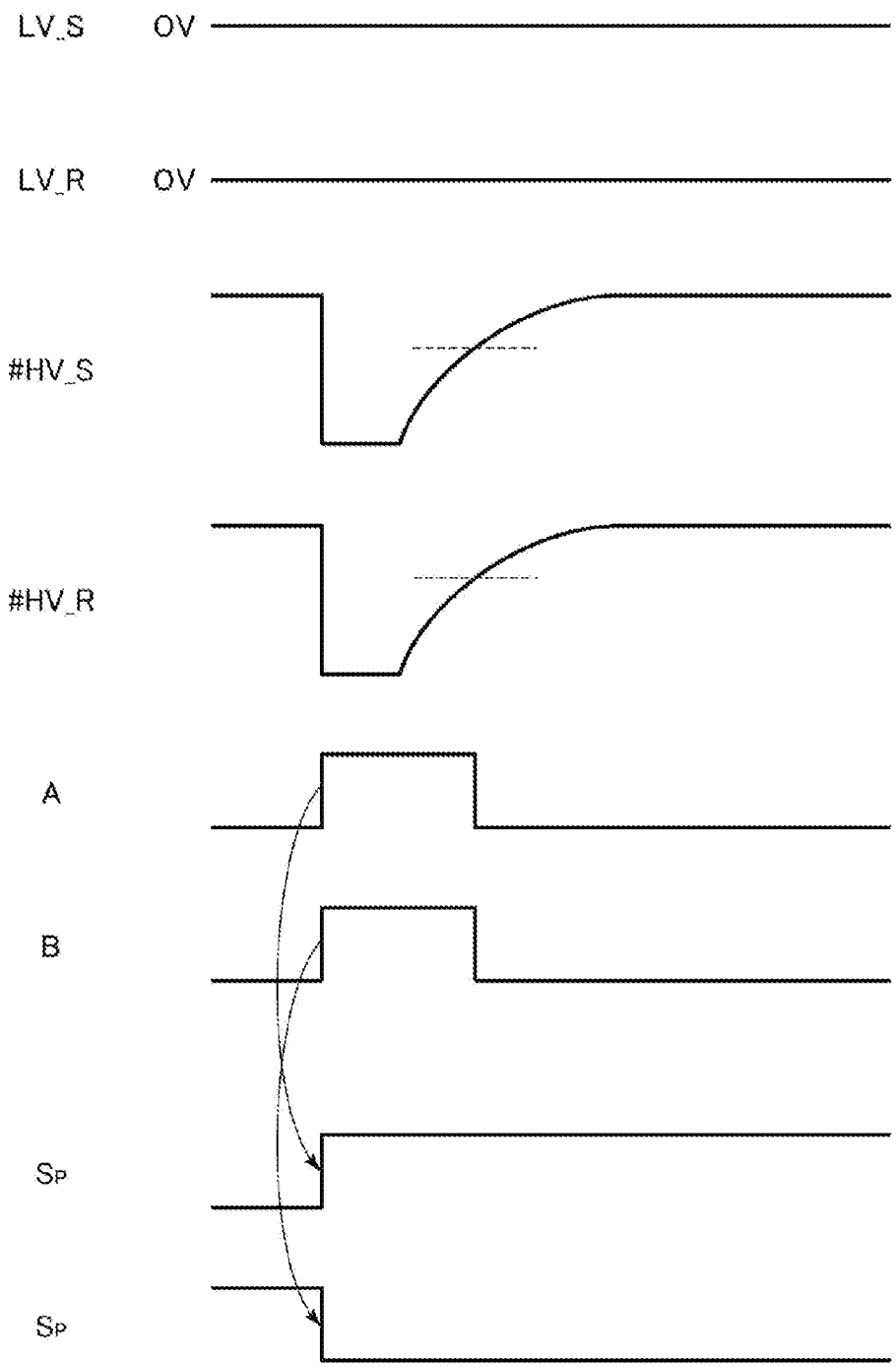
FIG. 3 is a waveform diagram illustrating an influence of noise of the level shifter and the waveform shaper.

Hereinafter, embodiments of the present disclosure will be described with reference to the drawings. The same or equivalent components, members, and processes illustrated in each drawing are given by the same reference numerals and a repeated description thereof will be properly omitted. Also, the embodiments are presented by way of example only and not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected to each other but also a case where the member A and the member B are indirectly connected through any other member that does not affect an electrical connection state thereof.

Similarly, "a state where a member C is installed between a member A and a member B" also includes a case where the member A and the member C or the member B and the member C are indirectly connected through any other member that does not affect an electrical connection state but also a case where the member A and the member C or the member B and the member C are directly connected.

Figure 4:
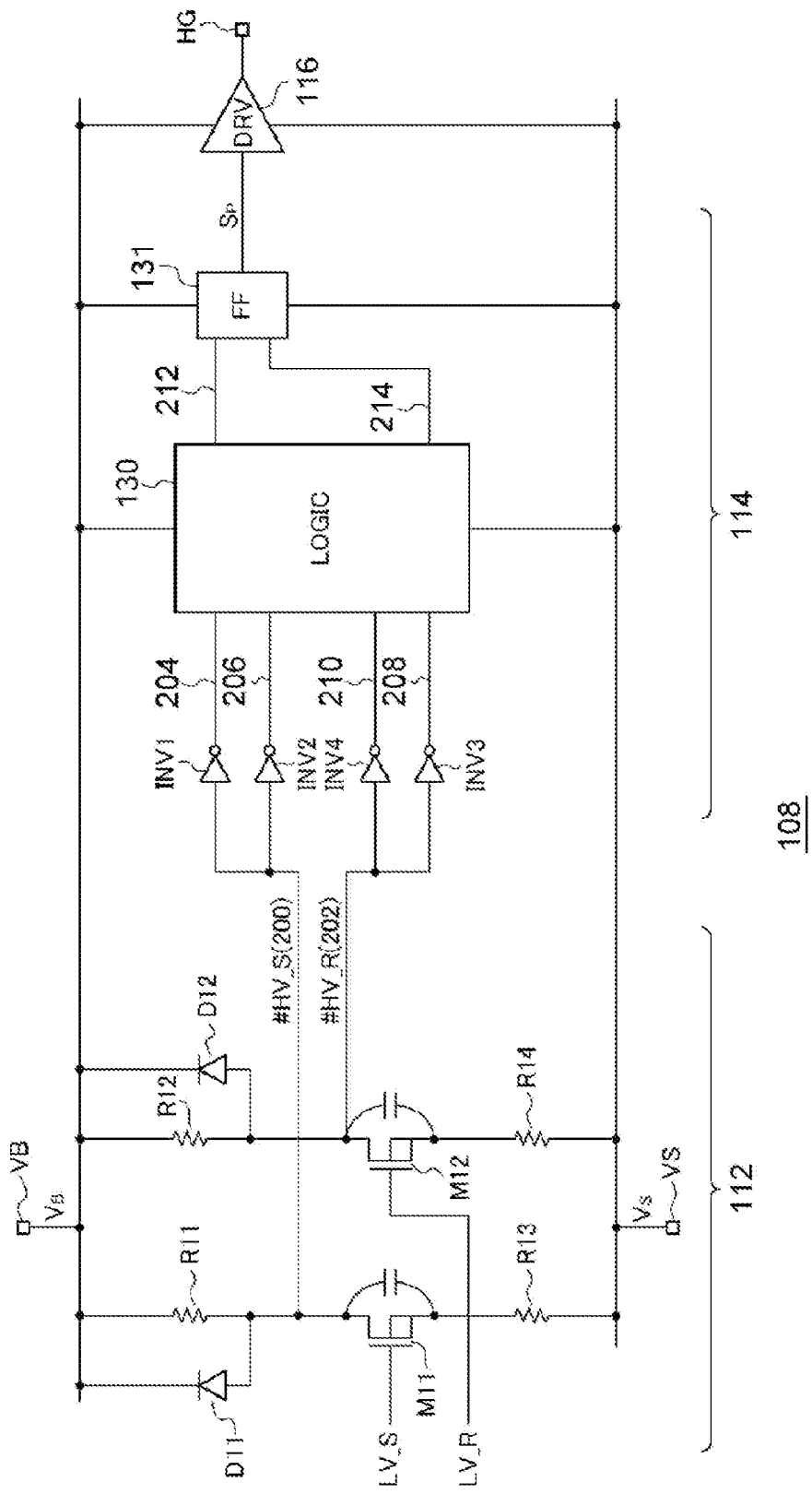
FIG. 4 is a circuit diagram of a gate driving circuit according to an embodiment.

FIG. 4 is a circuit diagram of a gate driving circuit 108 according to the embodiment. The gate driving circuit 108 is utilized in the switching output circuit 100r of FIG. 1, and drives the high-side transistor and the low-side transistor. In the present disclosure, the configuration of the low side is not particularly limited and a known technique may be used, and thus, only the configuration of the high side is illustrated in FIG. 4 and the low side is omitted. The gate driving circuit 108 is a functional integrated circuit (IC) integrated in a single semiconductor substrate.

When an input set pulse LV_S is asserted (set to high level in a positive logic system), the gate driving circuit 108 turns on the high-side transistor M1, and when an input reset pulse LV_R is asserted, the gate driving circuit 108 turns off the high-side transistor M1.

The gate driving circuit 108 includes a level shifter 112, a waveform shaper 114, and a high-side driver 116.

The level shifter 112 receives the input set pulse LV_S and the input reset pulse LV_R that swing between $V_{CC}$ and 0 V, and level-shifts the received input set pulse LV_S and the input reset pulse LV_R to swing between $V_B$ and $V_S$, to generate an intermediate set pulse 200 (#HV_S) and an intermediate reset pulse 202 (#HV_R). The intermediate set pulse 200 (#HV_S) and the intermediate reset pulse 202 (#HV_R) have inverted logics with respect to the input set pulse LV_S and the reset pulse LV_R.

The level shifter 112 includes N-channel MOS transistors M11 and M12 of high voltage, resistors R11 to R14, and diodes D11 and D12. The resistors R13 and R14 can be omitted. Also, the configuration of the level shifter 112 is not particularly limited and may be configured using other known techniques.

The waveform shaper 114 includes first to fourth inverters INV1 to INV4, a logic circuit 130, and a flip-flop 131. The first inverter INV1 has a first threshold value $V_{TH1}$, and receives the intermediate set pulse 200 to generate a first set pulse 204 (S1). The first set pulse 204 has the same logic level as that of the original input set pulse LV_S.

The second inverter INV2 has a second threshold value $V_{TH2}$ different from the first threshold value $V_{TH1}$, and receives the intermediate set pulse 200 to generate a second set pulse 206. The second threshold value $V_{TH2}$ is set to be higher than the first threshold value $V_{TH1}$. A method for changing a threshold value of an inverter is not particularly limited and a known technique may be used. For example, a different threshold value may be set by changing the size of a PMOS transistor and an NMOS transistor of a CMOS inverter, or by inserting a resistor in a current path of an inverter.

The third inverter INV3 has the first threshold value $V_{TH1}$, and receives the intermediate reset pulse 202 to generate a first reset pulse 208 (R1). The first reset pulse 208 has the same logic level as that of the original input reset pulse LV_R. The fourth inverter INV4 has the second threshold value $V_{TH2}$, and receives the intermediate reset pulse 202 to generate a second reset pulse 210.

The logic circuit 130 masks the first set pulse 204 using the second reset pulse 210 to generate an output set pulse 212 (S3), and masks the first reset pulse 208 using the second set pulse 206 to generate an output reset pulse 214 (R3).

The flip-flop 131 receives the output set pulse 212 and the output reset pulse 214, and outputs a driving pulse $S_P$ of which a level transitions according to the output set pulse 212 and the output reset pulse 214. The high-side driver 116 drives the high-side transistor M1 according to the driving pulse $S_P$.

The foregoing is the basic configuration of the gate driving circuit 108 according to the embodiment. Subsequently, specific configuration examples thereof will be described.

Figure 5:
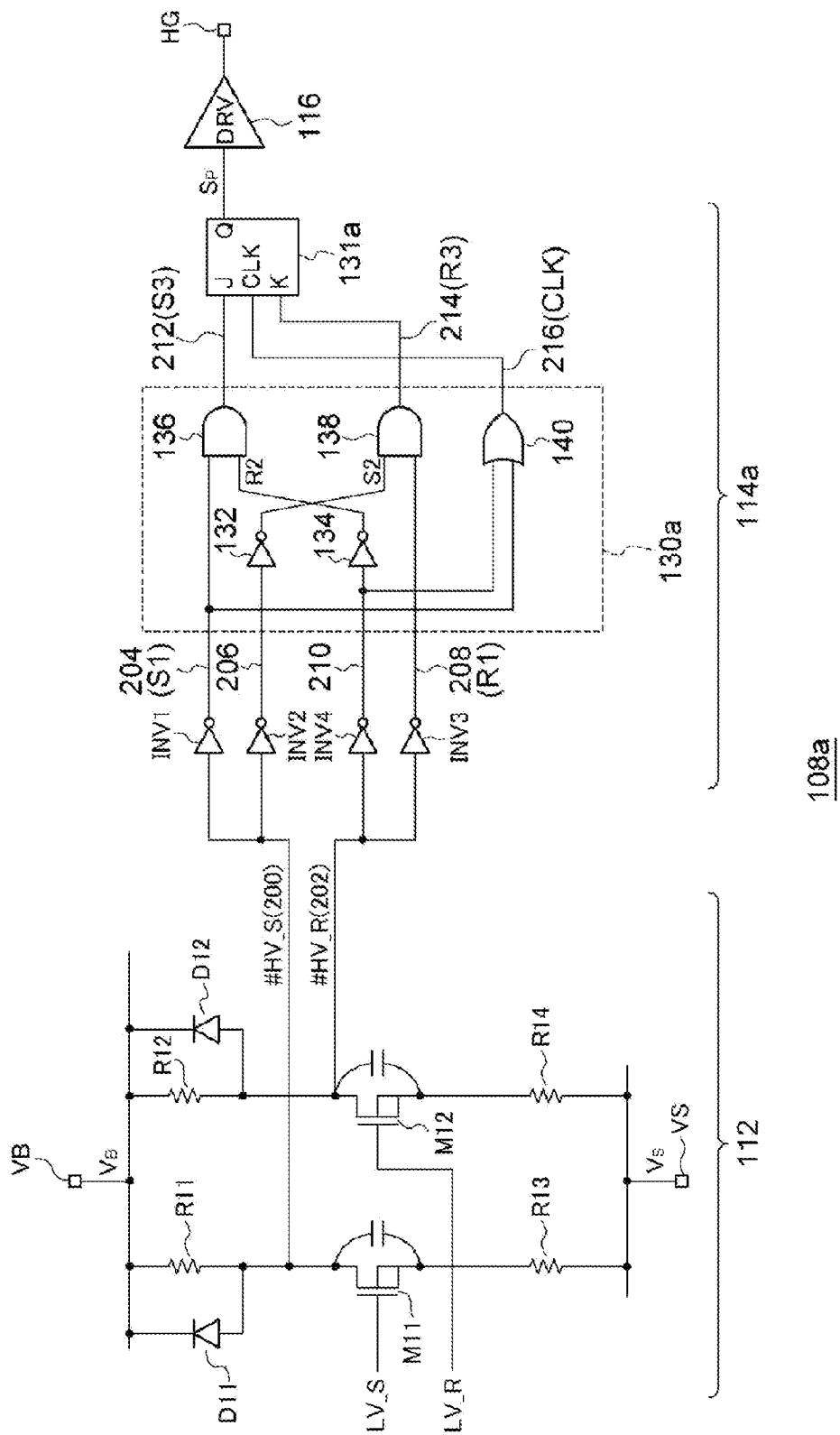
FIG. 5 is a circuit diagram of a gate driving circuit according to a first configuration example.

FIG. 5 is a circuit diagram of a gate driving circuit 108a according to a first configuration example. A logic circuit 130a includes an inverter 132, an inverter 134, a first AND gate 136, a second AND gate 138, and an OR gate 140.

The inverters 132 and 134 invert the second set pulse 206 and the second reset pulse 210, respectively. The first AND gate 136 outputs a logical product of the first set pulse 204 and an inverted signal (output R2 from the inverter 134) of the second reset pulse 210, as an output set pulse 212. The second AND gate 138 outputs a logical product of the first reset pulse 208 and an inverted signal (output S2 from the inverter 132) of the second set pulse 206, as an output reset pulse 214. The OR gate 140 outputs a logical sum of the first set pulse 204 and the second reset pulse 210, as a clock signal 216 CLK.

The logic circuit 130a includes a JK flip-flop. The JK flip-flop receives the output set pulse 212 at a J terminal, receives the output reset pulse 214 at a K terminal, and receives a clock signal 216 at a clock terminal CLK to output a driving pulse $S_P$ from an output terminal Q.

The foregoing is the configuration of the gate driving circuit 108a. Hereinafter, an operation thereof will be described, but prior to this, a problem that may arise in the gate driving circuit 108 will be described.

Figure 6A:
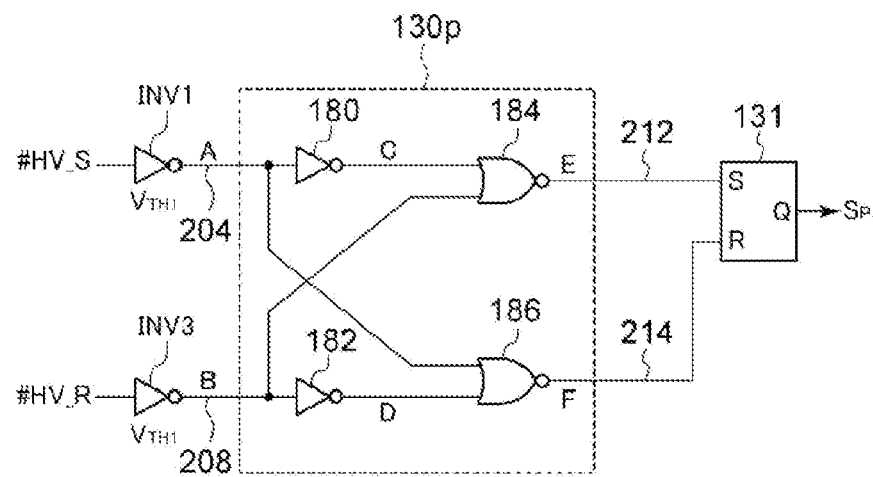
FIGS. 6A and 6B are circuit diagrams of a waveform shaper according to another configuration example reviewed by the present inventors.
Figure 6B:
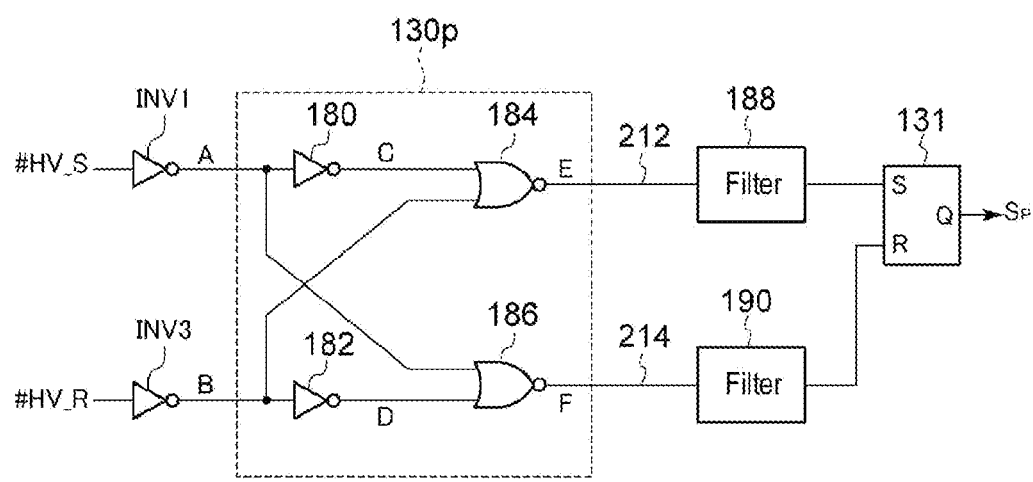

FIGS. 6A and 6B are circuit diagrams of a waveform shaper 114p according to another configuration example reviewed by the present inventors. Threshold values of the first inverter INV1 and the third inverter INV3 are the first threshold value $V_{TH1}$.

The logic circuit 130p masks a first set pulse 204 (A) by directly using a first reset pulse 208 (B), and masks a first reset pulse 208 (B) by directly using a first set pulse 204 (A). Inverters 180 and 182 invert the first set pulse 204 and the first reset pulse 208. The NOR gate 184 outputs a negative logic of an output C of the inverter 180 and the first reset pulse 208, as an output set pulse 212 (E), to a set terminal of an RS flip-flop 131. The NOR gate 186 outputs a negative logic of an output D of the inverter 182 and the first set pulse 204, as an output reset pulse 214 (F), to a reset terminal of the RS flip-flop 131.

FIG. 7A is a waveform view of the waveform shaper 114p of FIG. 6A, which illustrates waveforms when the time constants of set and reset of the level shifter 112 at a front stage are equal to each other. In this case, even though the first set pulse 204 (#HV_S) and the first reset pulse 208 (#HV_R) transition due to noise, the output set pulse 212 (E) and the output reset pulse 214 (F) do not transition. That is, an influence of the noise is eliminated.

FIG. 7B is a waveform view of the waveform shaper 114p of FIG. 6A, which illustrates the time constants of the set and reset of the level shifter 112 at the front stage are different from each other. In this case, when the first set pulse 204 (#HV_S) and the first reset pulse 208 (#HV_R) transition due to noise, the output set pulse 212 (E) is asserted to thereby affect the driving pulse SP, so that a problem arises in that the influence of noise cannot be eliminated (called a "first technical problem"). When the time constant of the reset side is long, the output reset pulse 214 (F) is asserted unintentionally.

FIG. 6B is a circuit diagram of a waveform shaper 114q modified to solve the first technical problem. The waveform shaper 114q includes filters 188 and 190 for eliminating noise of the output set pulse 212 and the output reset pulse 214. Accordingly, as shown in the waveform E of FIG. 7B, the noise of the output set pulse 212 and the output reset pulse 214 can be eliminated. However, another problem arises in the configuration of FIG. 6B. FIG. 7C is a diagram illustrating operation waveforms when the input set pulse LV_S is asserted during a normal operation. In this case, due to the filter 188 for noise elimination, the output set pulse 212 (E) is delayed and an operation speed of the waveform shaper 114q is lowered. The filter 190 also causes the same problem (called a "second technical problem").

Where this problem is revealed, it returns to the description of the gate driving circuit 108a according to the embodiment. FIGS. 8A and 8B are operation waveform diagrams of the gate driving circuit 108a. First, an operation when the intermediate set pulse 200 and the intermediate reset pulse 202 are simultaneously asserted due to an influence of noise will be described with reference to FIG. 8A. The time constants of the intermediate set pulse #HV_S and the intermediate reset pulse #HV_R are different from each other due to unbalance between the set side and the reset side of the level shifter 112.

Since the threshold value $V_{TH2}$ of the second inverter INV2 is set to be higher than the threshold value $V_{TH1}$ of the first inverter INV1, a pulse width of the set pulse S2 as a mask is stretched to be longer than that of the set pulse S1. Similarly, a pulse width of the reset pulse R2 as a mask is stretched to be longer than that of the reset pulse R1. Since the reset pulse R1 is masked using the stretched set pulse S2 and the set pulse S1 is similarly masked using the stretched reset pulse R2, the output set pulse 212 (S3) and the output reset pulse 214 (R3) are not asserted. That is, the foregoing first technical problem can be resolved.

Subsequently, an operation when the input set pulse LV_S is asserted during a normal operation will be described with reference to FIG. 8B. As soon as the intermediate set pulse #HV_S transitions to a low level, the set pulse S3 transitions to a high level and the driving pulse $S_P$ transitions. This is to make it such that the filters for delaying the set pulses S1, S2, and S3 illustrated in FIG. 6B no longer needs to be present. The second technical problem can also be resolved by the gate driving circuit 108 according to this embodiment. That is, a high speed operation can be realized, while suppressing an influence of noise. A capacitor is generally required to configure a filter, which results in increasing a circuit area. However, since the filterless structure is provided, an effect of reducing a circuit area can be also obtained.

Subsequently, another configuration example of the gate driving circuit 108 will be described.

Figure 9A:
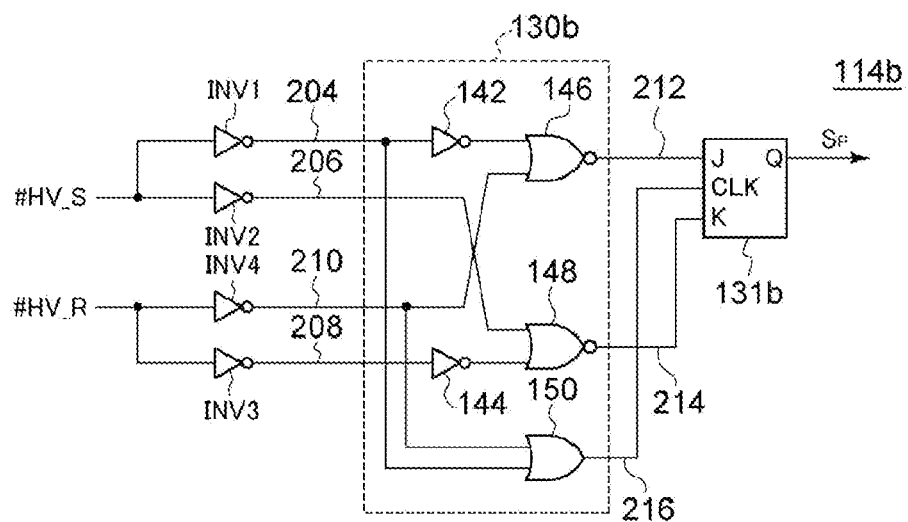
FIGS. 9A to 9C are circuit diagrams of a waveform shaper according to second to fourth configuration examples.

FIG. 9A is a circuit diagram of a waveform shaper 114b according to a second configuration example. A logic circuit 130b includes inverters 142 and 144, a first NOR gate 146, a second NOR gate 148, and an OR gate 150. The inverters 142 and 144 invert the first set pulse 204 and the first reset pulse 208, respectively. The first NOR gate 146 outputs a negative logical sum of an inverted signal of the first set pulse 204 and the second reset pulse 210, as an output set pulse 212. The second NOR gate 148 outputs a negative logical sum of an inverted signal of the first reset pulse 208 and the second set pulse 206, as an output reset pulse 214. The OR gate 150 outputs a logical sum of the first set pulse 204 and the second reset pulse 210, as a clock signal 216. A JK flip-flop 131b receives the output set pulse 212 at a J terminal, receives the output reset pulse 214 at a K terminal, receives the clock signal 216 at a clock terminal, and outputs a driving pulse $S_P$.

Figure 9B:
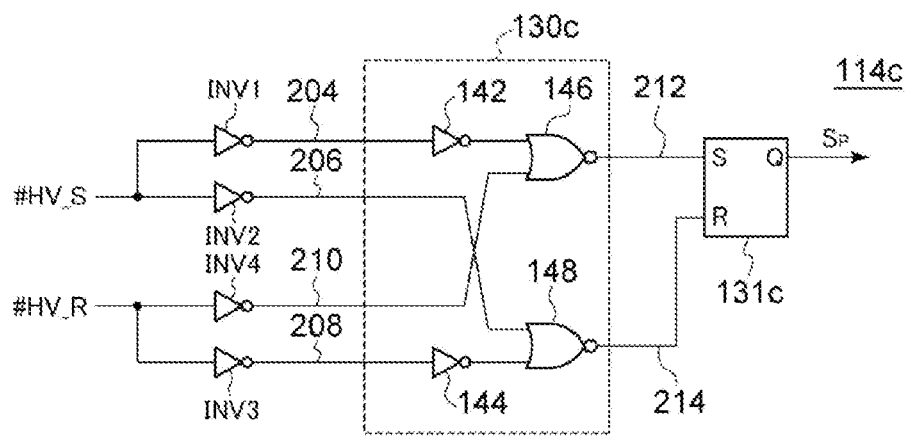

FIG. 9B is a circuit diagram of a waveform shaper 114c according to a third configuration example. A logic circuit 130c includes inverters 142 and 144, a first NOR gate 146, and a second NOR gate 148. A flip-flop 131c includes an RS flip-flop. The output set pulse 212 is input to a set terminal of the RS flip-flop, and the output reset pulse 214 is input to a reset terminal of the RS flip-flop.

Figure 9C:
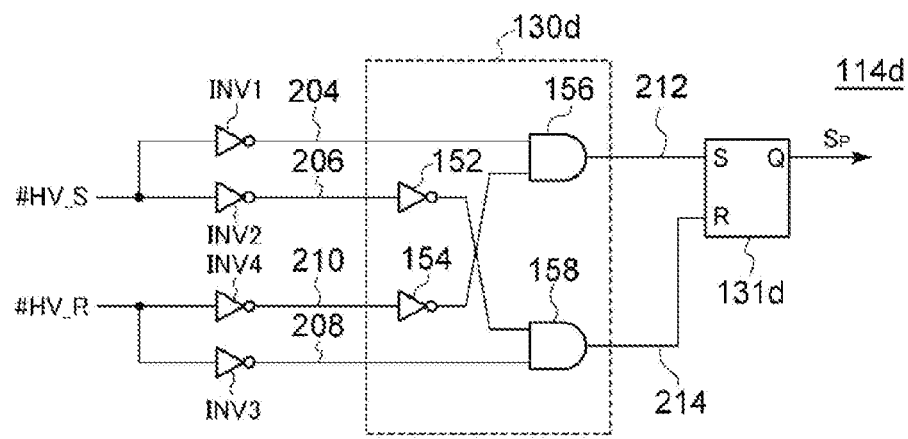

FIG. 9C is a circuit diagram of a waveform shaper 114d according to a fourth configuration example. A logic circuit 130d includes inverters 152 and 154, a first AND gate 156, and a second AND gate 158. The inverters 152 and 154 invert the second set pulse 206 and the second reset pulse 210, respectively. The first AND gate 156 outputs a logical product of the first set pulse 204 and an inverted signal of the second reset pulse 210, as an output set pulse 212. The second AND gate 158 outputs a logical product of the first reset pulse 208 and an inverted signal of the second set pulse 206, as an output reset pulse 214.

According to a person skilled in the art, it should be understood that the waveform shapers 114b to 114d of FIGS. 9A to 9C are equivalent to the waveform shaper 114a of FIG. 5, so that the same effect as that of the waveform shaper 114a of FIG. 5 can be obtained.

Figure 10:
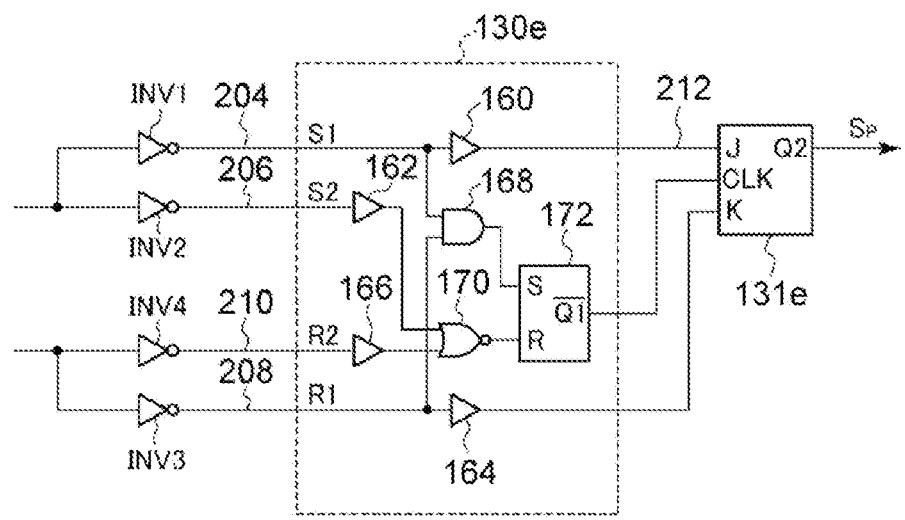
FIG. 10 is a circuit diagram of a waveform shaper according to a fifth configuration example.

FIG. 10 is a circuit diagram of a waveform shaper 114e according to a fifth configuration example. Buffers 160, 162, 164, and 166 receive a first set pulse 204, a second set pulse 206, a first reset pulse 208, and a second reset pulse 210, respectively. The buffers do not affect a logic level of a signal. An AND gate 168 generates a logical product of the first set pulse 204 and the first reset pulse 208. A NOR gate 170 generates a negative logical sum of the second set pulse 206 and the second reset pulse 210. An RS flip-flop 172 receives an output of the AND gate 158 at a set terminal thereof, receives an output of the NOR gate 170 at a reset terminal thereof, and outputs a clock signal 216 from an inverted output terminal thereof. A logic circuit 130e outputs the first set pulse 204, which has passed through the buffer 160, as an output set pulse 212, and the first reset pulse 208, which has passed through the buffer 164, as an output reset pulse 214. A flip-flop 131e includes a JK flip-flop, receives the output set pulse 212 at a J terminal thereof, receives the output reset pulse 214 at a K terminal thereof, receives the clock signal 216 at a clock terminal thereof, and outputs a driving pulse $S_P$.

Figure 11A:
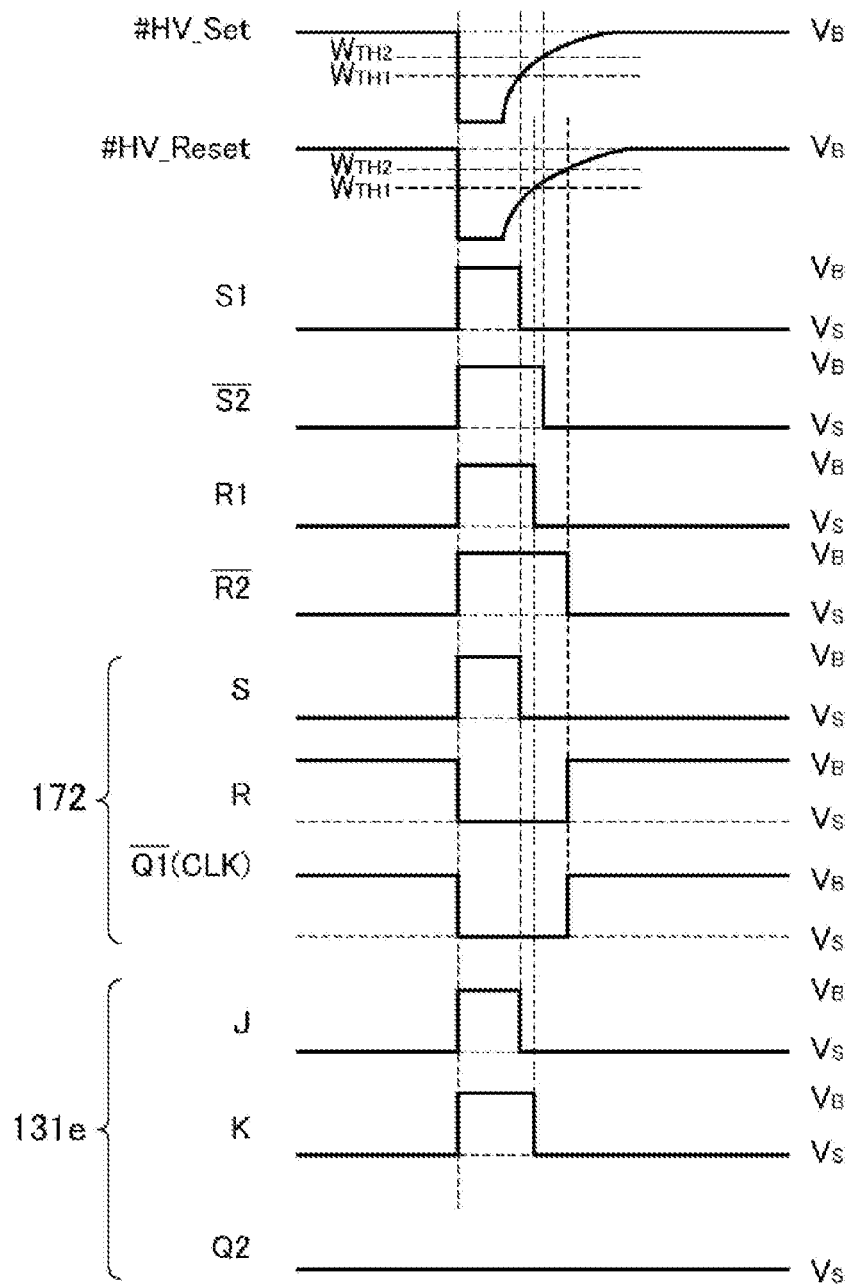
FIGS. 11A and 11B are operation waveform diagrams of the waveform shaper of FIG. 10.
Figure 11B:
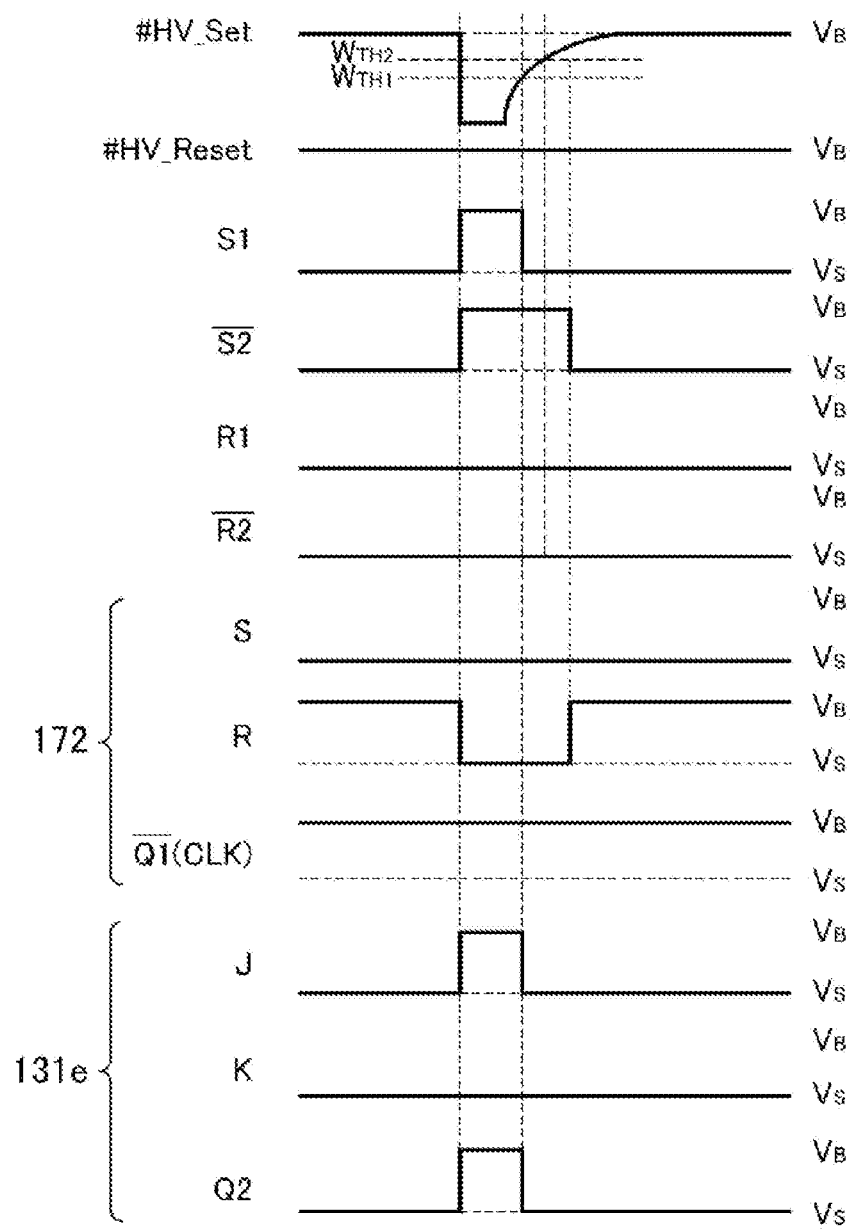

FIGS. 11A and 11B are diagrams showing operation waveforms of the waveform shaper 114e of FIG. 10. FIG. 11A is a diagram showing waveforms when the intermediate set pulse #HV_S and the intermediate reset pulse #HV_R simultaneously transition by an influence of noise. FIG. 11B is a diagram showing waveforms when the input set pulse LV_S is asserted during a normal operation. In this manner, the same effect as that of the waveform shaper 114a of FIG. 5 can also be obtained by the waveform shaper 114e of FIG. 10.

Figure 12:
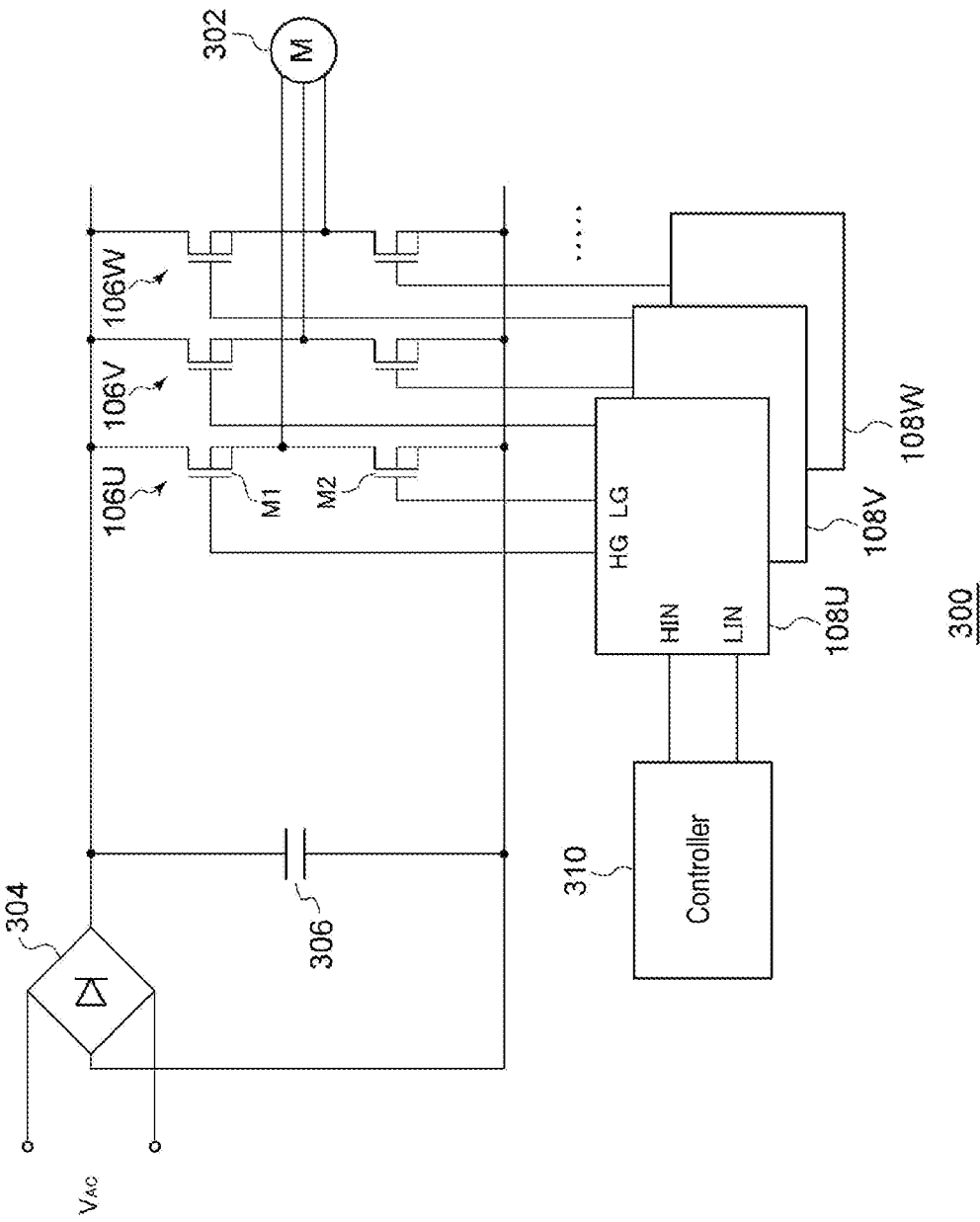
FIG. 12 is a block diagram of an electronic device including a gate driving circuit.

Finally, the applications of the gate driving circuit 108 will be described. FIG. 12 is a block diagram of an electronic device 300 including the gate driving circuit 108.

The electronic device 300 includes a motor 302, a rectifying circuit 304, a smoothing condenser 306, three-phase bridge circuits 106U to 106W, and gate driving circuits 108U to 108W. For example, the electronic device 300 is an air-conditioner, a refrigerator, or the like, and the motor 302 is a three-phase motor for rotating a compressor.

The rectifying circuit 304 full-wave-rectifies an AC voltage $V_{AC}$. The smoothing condenser 306 smoothes the rectified AC voltage. Outputs of U phase to W phase of the three-phase bridge circuits 106 are connected to the motor 302. The gate driving circuits 108U to 108W drive the corresponding bridge circuits 106U to 106W. A controller 310 generates control signals $S_{IN\_H}$ and $S_{IN\_L}$ for instructing ON and OFF of the high-side transistor M1 and the low-side transistor M2 for each phase, and outputs the control signals $S_{IN\_H}$ and $S_{IN\_L}$ to the corresponding gate driving circuits 108U to 108W.

The gate driving circuit 108 can be applied to not only an application for driving the three-phase motor but also an application for driving a single-phase motor. In this case, a single bridge circuit 106 may be used as a half bridge circuit or two bridge circuits 106 may be used as an H bridge circuit (a full bridge circuit).

The gate driving circuit 108 can be also used for an application in addition to the inverter (motor driving circuit). For example, the bridge circuit 106 can be also used in a DC/DC converter, an AC/DC converter, and a PFC circuit.

Further, the waveform shapers 114p and 114q of FIGS. 6A and 6B referred to clarify the object of the present disclosure should not be admitted as a known technique and may be recognized as an aspect of the present disclosure.

According to the present disclosure in some embodiments, it is possible to provide a gate driving circuit operating at a high speed, while suppressing an influence of noise.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gate driving circuit for turning on a high-side transistor when an input set pulse is asserted, and turning off the high-side transistor when an input reset pulse is asserted, comprising:
    a level shift circuit configured to level-shift each of the input set pulse and the input reset pulse to generate an intermediate set pulse and an intermediate reset pulse;
    a first inverter configured to receive the intermediate set pulse to generate a first set pulse;
    a third inverter configured to receive the intermediate reset pulse to generate a first reset pulse;
    a logic circuit including:
        a first logic unit configured to receive the first set pulse and the first reset pulse, and mask the first set pulse by using the first reset pulse to generate an output set pulse; and
        a second logic unit configured to receive the first set pulse and the first reset pulse, and mask the first reset pulse by using the first set pulse to generate an output reset pulse;
    a flip-flop configured to receive the output set pulse and the output reset pulse to thereby output a driving pulse of which a level transitions; and
    a driver configured to drive the high-side transistor according to the driving pulse.

2. The gate driving circuit of claim 1, wherein the gate driving circuit is integrated on a single semiconductor substrate.

3. A switching output circuit, comprising:
    a bridge circuit including a high-side transistor and a low-side transistor; and
    the gate driving circuit of claim 1, configured to drive the high-side transistor and the low-side transistor.

4. An inverter device, comprising:
    a bridge circuit including a high-side transistor and a low-side transistor; and
    the gate driving circuit of claim 1, configured to drive the high-side transistor and the low-side transistor.

5. An electronic device, comprising:
    a bridge circuit including a high-side transistor and a low-side transistor;
    the gate driving circuit of claim 1, configured to drive the high-side transistor and the low-side transistor; and
    a motor connected to the bridge circuit.

6. A gate driving circuit for turning on a high-side transistor when an input set pulse is asserted, and turning off the high-side transistor when an input reset pulse is asserted, comprising:
 a level shift circuit configured to level-shift each of the input set pulse and the input reset pulse to generate an intermediate set pulse and an intermediate reset pulse;
 a first inverter configured to receive the intermediate set pulse to generate a first set pulse;
 a third inverter configured to receive the intermediate reset pulse to generate a first reset pulse;
 a logic circuit including:
  a first logic unit configured to receive the first set pulse and the first reset pulse, and invalidate assertion of the first set pulse when the first set pulse and the first reset pulse are simultaneously asserted; and
  a second logic unit configured to receive the first set pulse and the first reset pulse, and invalidate assertion of the first reset pulse when the first set pulse and the first reset pulse are simultaneously asserted;
 a flip-flop configured to receive the first set pulse and the first reset pulse which have passed through the logic circuit to thereby output a driving pulse of which level transitions; and
 a driver configured to drive the high-side transistor according to the driving pulse.

7. The gate driving circuit of claim 6, wherein the gate driving circuit is integrated on a single semiconductor substrate.

8. A switching output circuit, comprising:
 a bridge circuit including a high-side transistor and a low-side transistor; and
 the gate driving circuit of claim 6, configured to drive the high-side transistor and the low-side transistor.

9. An inverter device, comprising:
 a bridge circuit including a high-side transistor and a low-side transistor; and
 the gate driving circuit of claim 6, configured to drive the high-side transistor and the low-side transistor.

10. An electronic device, comprising:
 a bridge circuit including a high-side transistor and a low-side transistor;
 the gate driving circuit of claim 6, configured to drive the high-side transistor and the low-side transistor; and
 a motor connected to the bridge circuit.

\* \* \* \* \*